US006812733B1

(12) United States Patent
Plasterer et al.

(10) Patent No.: US 6,812,733 B1
(45) Date of Patent: Nov. 2, 2004

(54) HIGH-EFFICIENCY MIXED VOLTAGE/CURRENT MODE OUTPUT DRIVER

(75) Inventors: John Philip Plasterer, Burnaby (CA); Jurgen Hissen, Burnaby (CA); Victor Lee, Burnaby (CA)

(73) Assignee: PMC-Sierra, Inc., Santa Clara, CA (US)

( * ) Notice: Subject to any disclaimer, the term of this patent is extended or adjusted under 35 U.S.C. 154(b) by 28 days.

(21) Appl. No.: 10/210,076

(22) Filed: Aug. 2, 2002

(51) Int. Cl.[7] .................. H03K 17/16; H03K 19/094

(52) U.S. Cl. ................................ 326/30; 326/115

(58) Field of Search ................. 326/27, 30, 83, 326/86, 115

(56) References Cited

U.S. PATENT DOCUMENTS

| 4,952,818 A |   | 8/1990 | Erdelyi et al. |
|---|---|---|---|
| 5,471,498 A |   | 11/1995 | Kuo |
| 5,767,699 A |   | 6/1998 | Bosnyak et al. |
| 6,005,414 A | * | 12/1999 | Reay .................. 326/83 |
| 6,025,742 A | * | 2/2000 | Chan .................. 327/108 |
| 6,111,431 A |   | 8/2000 | Estrada |
| 6,531,896 B1 | * | 3/2003 | Song .................. 326/86 |

* cited by examiner

*Primary Examiner*—Daniel D. Chang
(74) *Attorney, Agent, or Firm*—Curtis B. Behmann; Borden Ladner Gervais LLP

(57) ABSTRACT

Circuits and devices for an efficient, mixed voltage/current mode output driver. An output driver circuit includes a series terminated voltage mode driver circuit parallel with a current mode driver circuit. The output driver allows for a highly efficient driver but with an easily controllable output. It can be used for driving single ended or doubly terminated transmission lines.

13 Claims, 6 Drawing Sheets

HIGH-EFFICIENCY MIXED VOLTAGE/CURRENT MODE OUTPUT DRIVER

FIELD OF INVENTION

The present invention relates to circuitry for drivers for digital outputs.

BACKGROUND TO THE INVENTION

The digital revolution has produced a need for analog circuitry that can be used for digital purposes, especially in the fields of telecommunications and networking.

Modern applications in the above fields require high efficiency driver circuitry that can drive both receiver and transmitter end terminations in a networked data communications link. Such an application requires an output voltage swing with a controllable amplitude along with high efficiency. Driver efficiency is dependent on the amount of drive current required to drive a given output voltage swing. Controllability is quantified by the ability to control dynamically the output voltage swing. Such controllability must also allow for the use of pre-emphasis and the use of variable output levels.

A number of solutions have been presented in the past that sought to provide the desired controllability and efficiency. Three architectures predominate in these solutions a single differential pair (Class A output driver), a class AB driver commonly used with LVDs (Low Voltage Differential Signalling) output drivers, and a series terminated voltage mode driver.

The class A output driver consists of a CMOS current source I drive connected to a differential pair of transistors that are, in turn, connected to the output resistors. The resistors act as parallel termination to the transmission line. The differential pair switches the current between the resistors depending on whether a logic 1 or a logic 0 is required to be driven on the transmission line. A schematic diagram of a class A single differential pair output driver circuit is illustrated in FIG. 1.

While the class A output driver is very simple and easy to implement, it is not very efficient. For 50 Ohm drivers (as in FIG. 1), this driver requires that Idrive=4×Vswing/100 to generate a differential output voltage swing of Vswing. This value for Idrive is 4 times the ideal current drive. The output voltage swing is controllable by adjusting the amount of current (Idrive) in the tail of the differential pair. The voltage Vswing is also controllable by putting many of these types of drivers in parallel to generate a larger swing.

A second known architecture is discussed below, and utilizes a class AB driver illustrated in FIG. 2. This circuit consists of two CMOS differential pairs of transistors. The top differential pair switches a PMOS current source and the bottom differential pair switches an NMOS current source. The outputs of these differential pairs are connected to a 100 Ohm differential termination resistor.

The circuit in FIG. 2 requires that Idrive (2×Vswing)/100 to generate a differential output voltage swing of Vswing. The output voltage swing is controllable by adjusting the amount of current in the tail of the current sources of the differential pairs. The swing can also be controlled by placing multiple instances of this circuit in parallel. This circuit has a very controllable output swing but it is not very efficient.

A third known architecture is that illustrated in FIG. 3. This circuit is a class AB voltage mode series terminated output driver implemented as a CMOS inverter drive with series termination. As can be seen, the circuit consists of two inverter circuits connected by a resistor divider circuit. An input signal and its complement are fed to the driver and, depending on the input, the inverters route current one way or the other. The inverters will always act in opposite directions and the direction of the current through the middle resistor in the resistor divider circuit determines whether the output is a logic 1 or a logic 0.

This third architecture, if designed properly, only requires that Idrive=Vswing/100 to drive an output voltage of Vswing. Unfortunately, the output swing is not adjustable and is completely dependent on the ratio of the resistor divider and the supply voltage level. Since the supply level and the resistor divider ratio are not easily dynamically controllable, the output voltage swing is not easily dynamically controllable.

From the above, the issues with the three architectures are clear—the single differential pair architecture and the class AB driver (FIGS. 1 and 2) both have controllable output voltage swing levels but are not very efficient. While the voltage mode driver has the desired efficiency, it does not have an easily controllable output voltage swing. What is therefore required is a driver that has the controllability of the first two designs and the efficiencies of the voltage mode driver.

SUMMARY OF THE INVENTION

The present invention provides circuits and devices for an efficient, controllable output driver. The output driver circuit includes a series terminated voltage mode driver circuit in parallel with a current mode driver circuit. This output driver allows for a highly efficient driver but with an easily controllable output. It can be used for driving single ended or differentially doubly terminated transmission lines. The efficiency is in the reduced amount of current drawn from the supply for a given output swing across a doubly terminated transmission line. The driver is capable of pre-emphasis and dynamically controllable output swings.

In a first aspect the present invention provides a driver circuit including:

an input, a voltage mode driver circuit connected in parallel with a current mode driver circuit, between a voltage source and ground, the outputs of said voltage and current mode drivers being connected in parallel and to a transmission line.

In a second aspect the present invention provides a driver circuit comprising:

a pair of inputs comprising a first input and a second input;

a series terminated voltage mode driver sub-circuit;

at least one current mode driver sub-circuit;

a pair of outputs comprising a first output and a second output, wherein each of the sub-circuits is coupled in parallel to each one of the pair of outputs;

at least two of the sub-circuits are coupled in parallel to each one of the pair of inputs.

BRIEF DESCRIPTION OF THE DRAWINGS

A better understanding of the invention may be obtained by reading the detailed description of the invention below, in conjunction with the following drawings, in which.

DETAILED DESCRIPTION

Figure 1:
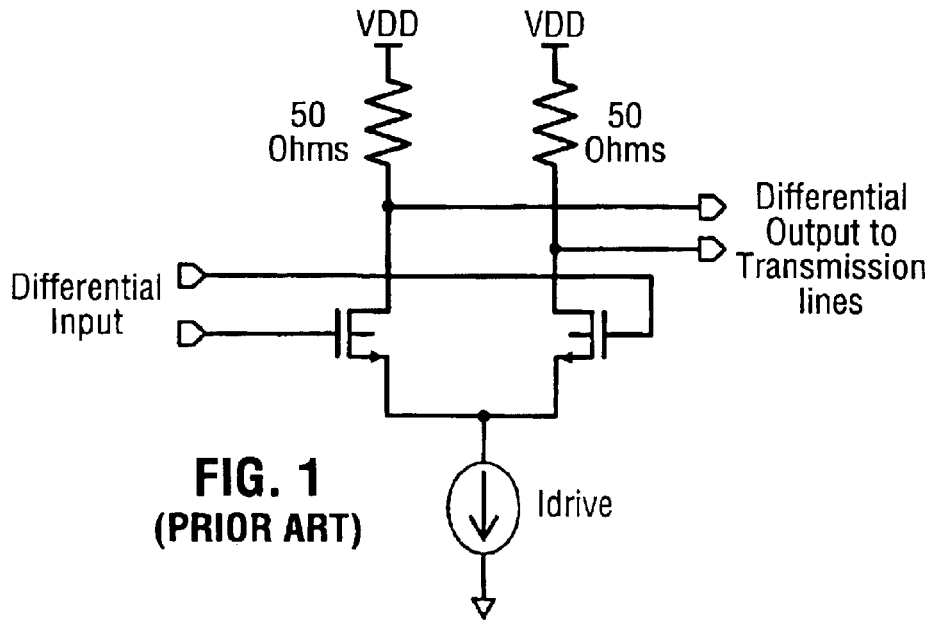
FIG. 1 is a schematic diagram of a class A single differential pair output driver circuit according to the prior art.
Figure 2:
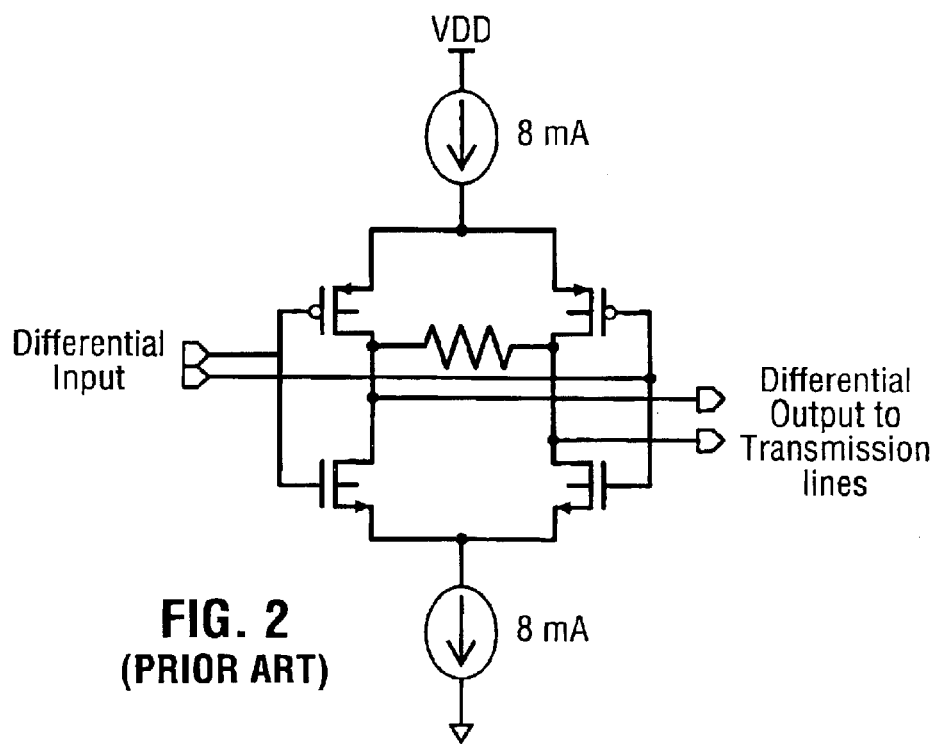
FIG. 2 is a schematic diagram of a class AB differential output driver circuit according to the prior art.
Figure 3:
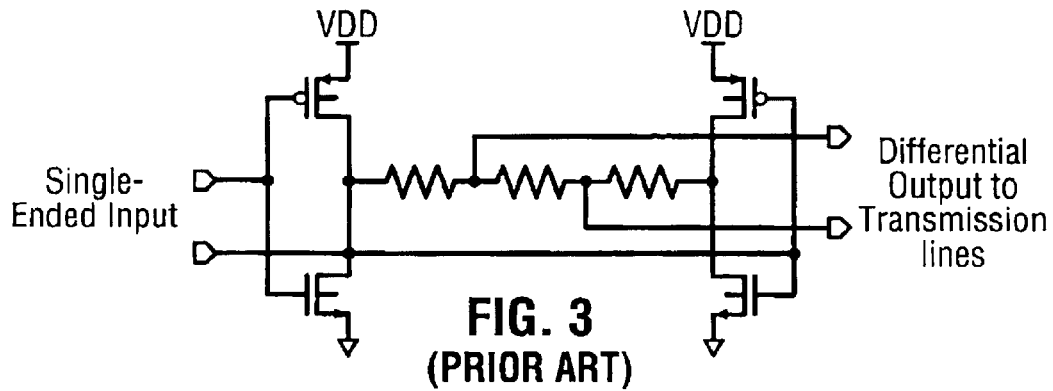
FIG. 3 is a schematic diagram of a voltage mode driver according to the prior art.
Figure 4:
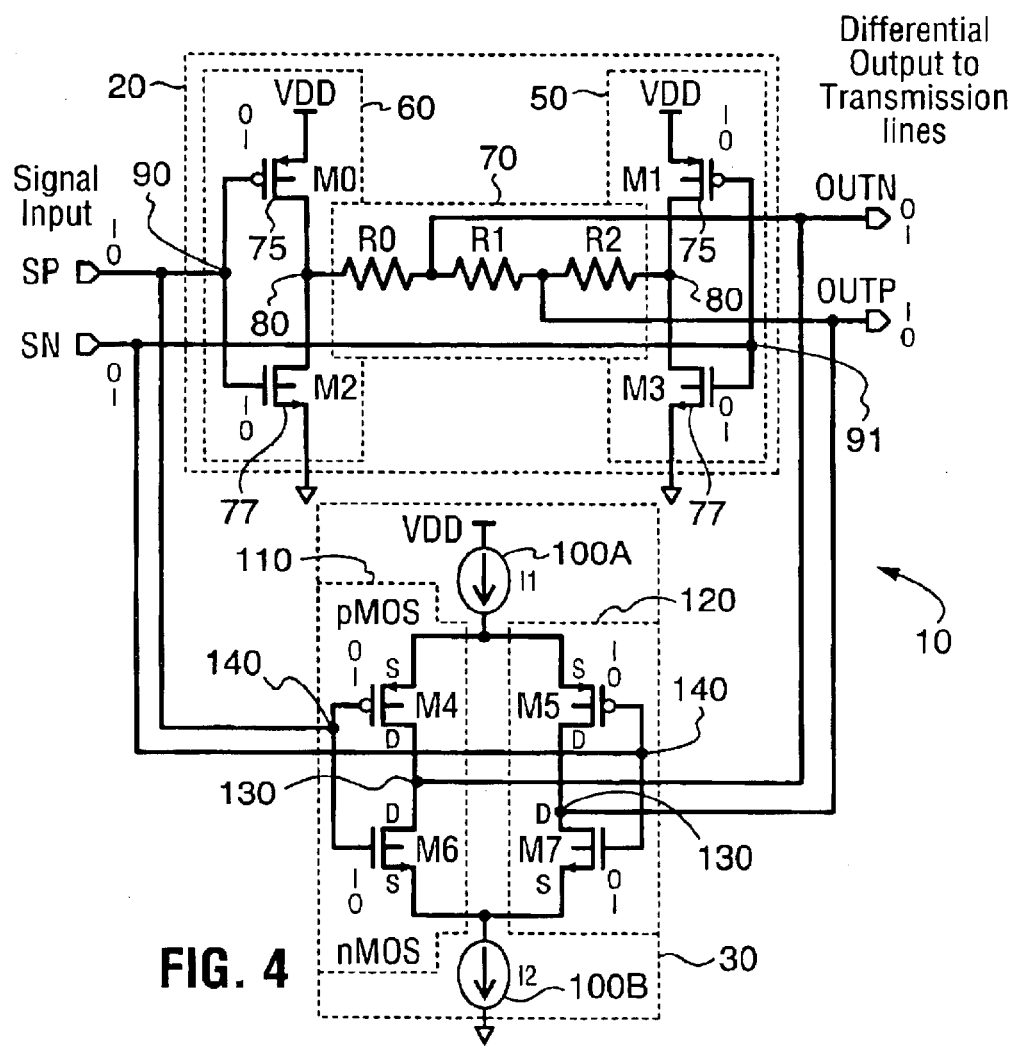
FIG. 4 is a schematic diagram of a mixed voltage/current mode output driver circuit according to one embodiment of the invention.

Referring to FIG. 4, a schematic diagram of a mixed voltage/current mode output driver according to one embodiment of the invention is presented. The driver 10 consists of a first sub-circuit 20 coupled in parallel with a second sub-circuit 30. A pair of differential inputs (SP,SN) are coupled in parallel to both of the sub-circuits 20 and 30. Similarly, a pair of differential outputs (OUTP, OUTN) are coupled in parallel to both of the sub-circuits 20 and 30.

The first sub-circuit 20 is a series terminated voltage mode driver circuit consisting of a pair of inverters 50 and 60 with a resistor divider circuit 70 consisting of resistors R0, R1, and R2 coupled between the inverters 50 and 60. Each of the pair of inputs SP and SN is coupled to a different inverter. Thus, the input SP is coupled to inverter 60 and input SN is coupled to inverter 50.

Each of the inverters 50 and 60 consists of a pair of transistors—a PMOS transistor (M0, M1) 75 and an nMOS transistor (M2, M3) 77. The inverters are arranged with the drain leads of both transistors coupled to a common output node 80. The source leads of the pMOS transistors 75 are connected to a voltage source (VDD) while the source leads of the nMOS transistors 77 are connected to ground.

Regarding the resistor divider circuit, three resistors R0, R1, R2, are connected in series between the respective common output nodes 80 of the two inverters 50, 60. Of the pair of outputs OUTN, OUTP, one (OUTN) is tapped from the junction node of resistors R0 and R1 while the other (OUTP) is tapped from the Junction node of resistors R1 and R2.

It should be noted that the input SP is coupled to an input node 90, and input SN is coupled to a common input node 91.

The second sub-circuit 30 is a current mode driver circuit, preferably of the class AB type. As can be seen, the sub-circuit 30 consists of two current sources, 100A, 100B, along with two pairs of transistors 110 and 120. Each pair consists of a pMOS transistor (M4, M5) and an nMOS transistor (M6, M7). For each pair of transistors 110, 120, the source lead of the pMOS transistors M4 and M5 are coupled to the current source 100A, the drain leads are coupled to output nodes 130 and the gate leads are coupled to an input node 140. For each of the nMOS transistors M6 and M7, the source lead is coupled to the current source 100B, the drain leads are coupled to the output nodes 130, and the gate leads are coupled to the Input nodes 140. As can be seen in FIG. 4, for each pMOS transistor that has a gate lead coupled to an input, the nMOS transistor that has its gate lead coupled to the same input must also have its drain lead coupled to the same output as the drain output of the pMOS transistor.

It should be noted that each of the inputs SP and SN is coupled to one of the input nodes 140. Also, each of the output nodes 130 is coupled to one the outputs OUTN and OUTP. It should also be noted that the two inputs SP, SN are complements of one another and that the outputs OUTN, OUTP are also complements of one another. The logical output of output OUTP mirrors the logical input of input SP. Also, the logical output of output OUTN mirrors the logical input of input SN.

The inputs SP, SN are rail-to-rail CMOS inputs such that a logic 1 is denoted as the difference between output node voltages (OUTP-OUTN) is positive, and a logic 0 is derived as when the difference output node voltages (OUTP-OUTN) is negative such that current sources 100A, 100B are compatible with the transistors. That is, the current source 100A is a pMOS current source and the current source 100B is an nMOS current source.

Ideally, the two pMOS transistors (M4, M5) in the second sub-circuit 30 are a differential pair and the two nMOS transistors M6, M7 in the same sub-circuit 30 are also a differential pair.

In order to output a logic 1 in the output OUTP, the input signal SP must be high (logic 1) and input SN must be low (logic 0). When this is the input, transistors M0, M3, M4, and M7 are off and transistors M1, M2, M5 and M6 are on. The resulting circuit is illustrated in FIG. 5.

Figure 5:
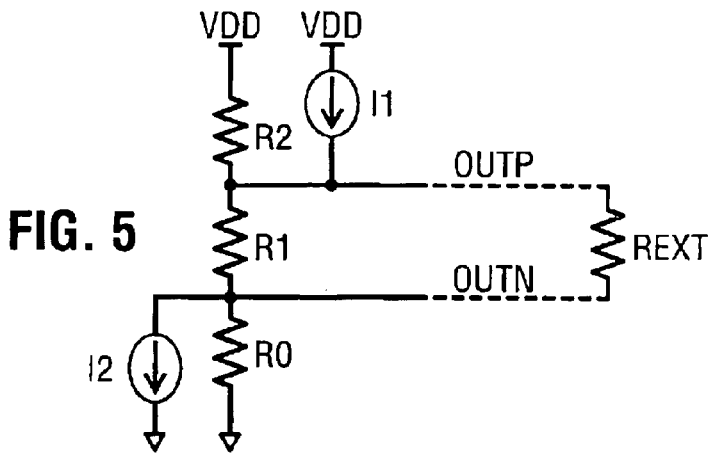
FIG. 5 is a schematic diagram of a simplified equivalent circuit when the circuit of FIG. 4 outputs a logic 1.

In order to calculate the current transfer of the output driver, the external receiver end termination resistor (REXT) in FIG. 5 must be accounted for. For standard 50-Ohm transmission lines this impedance is 100 ohms. In order to have transmitter end termination for a 50-Ohm transmission line the input impedance of the driver need only be 50 ohms. This means that the combination input impedance through the resistor network of R0, R1 and R2 looks like 50 ohms from the outside. However, ideal current efficiency occurs when R1 is sufficiently large and R0 and R2 are 50 ohms. The resistance R1 can be set large enough such that it had an insignificant impact on the output swing. The output swing can be calculated as:

$$V_{swing} = OUTP - OUTN = \frac{VDD * REXT}{R2 + R0 + REXT} + I1 * REXT \quad (1)$$

Since REXT=Zo=(R2+R0)|R1 and, for this example, R1 is sufficiently large, the equation (1) becomes;

$$V_{swing} = OUTP - OUTN = \frac{VDD}{2} + I1 * REXT \quad (2)$$

To measure current efficiency, this can be seen as the ratio between the amount of current that is drawn from the supply and the amount of current dissipated across the resistive load REXT. A ratio of 1 denotes 100% efficiency. Since it is obvious from FIG. 5 that if R1 is significantly large all the current flows through the receiver end termination resistor REXT, this driver is 100% efficient.

In order to output a logic "0" the input signal SP must be low and the input signal SN must be high, in this condition, transistors M0, M3, M4, and M7 are turned on and transistors M1, M2, M5, and M6 are turned off. Using a similar method as with a logic "1" it is easy to show that the output swing is:

$$V_{swing} = OUTP - OUTN = \frac{-VDD}{2} - I1 * REXT \qquad (3)$$

Figure 6:
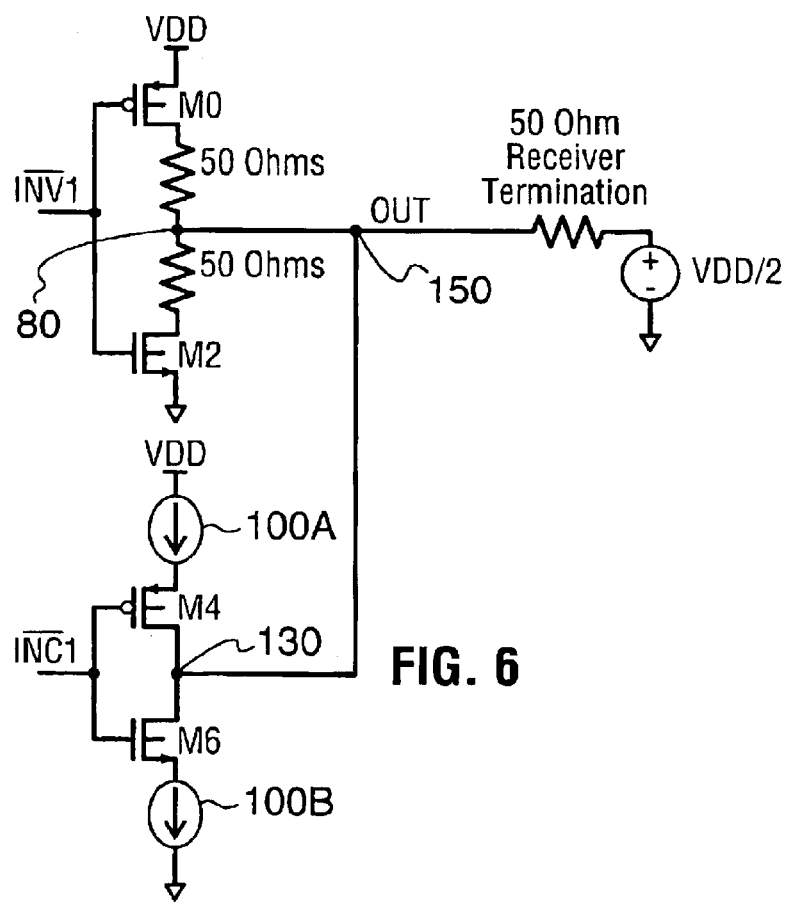
FIG. 6 is a single ended implementation of a voltage/current mode driver circuit.

The driver of FIG. 4 may also be used in single ended situations as shown in FIG. 6 where an inverter consisting of NMOS transistor M0 and PMOS transistor M2 form a differential pair output driver with its output in parallel with a current mode driver formed of CMOS transistors M4 and M6, which are connected to current sources 100A and 100B. In a single ended application, a series terminated voltage driver can be used in parallel with a current drive source to generate an output swing of controllable amplitude for doubly terminated transmission lines.

Figure 7:
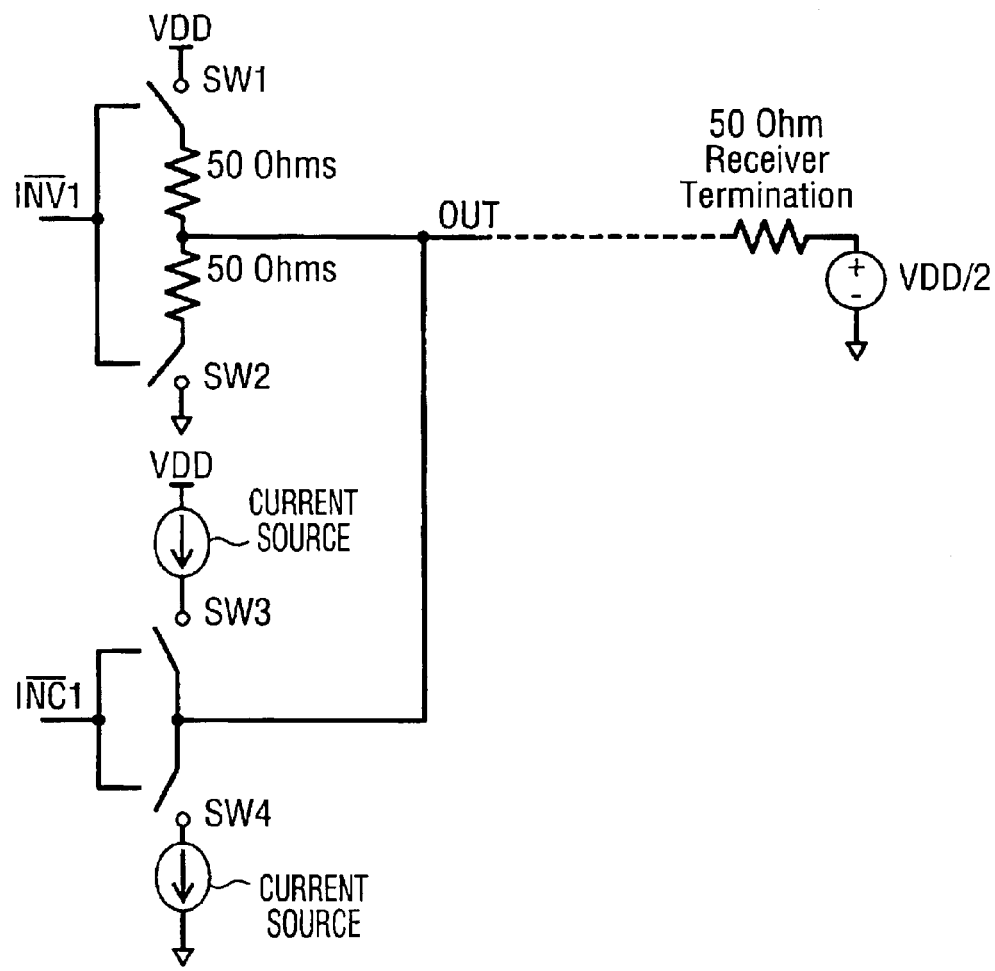
FIG. 7 is a schematic diagram of an ideal single ended driver in which the transistors are replaced by symbolic switches.
Figure 8:
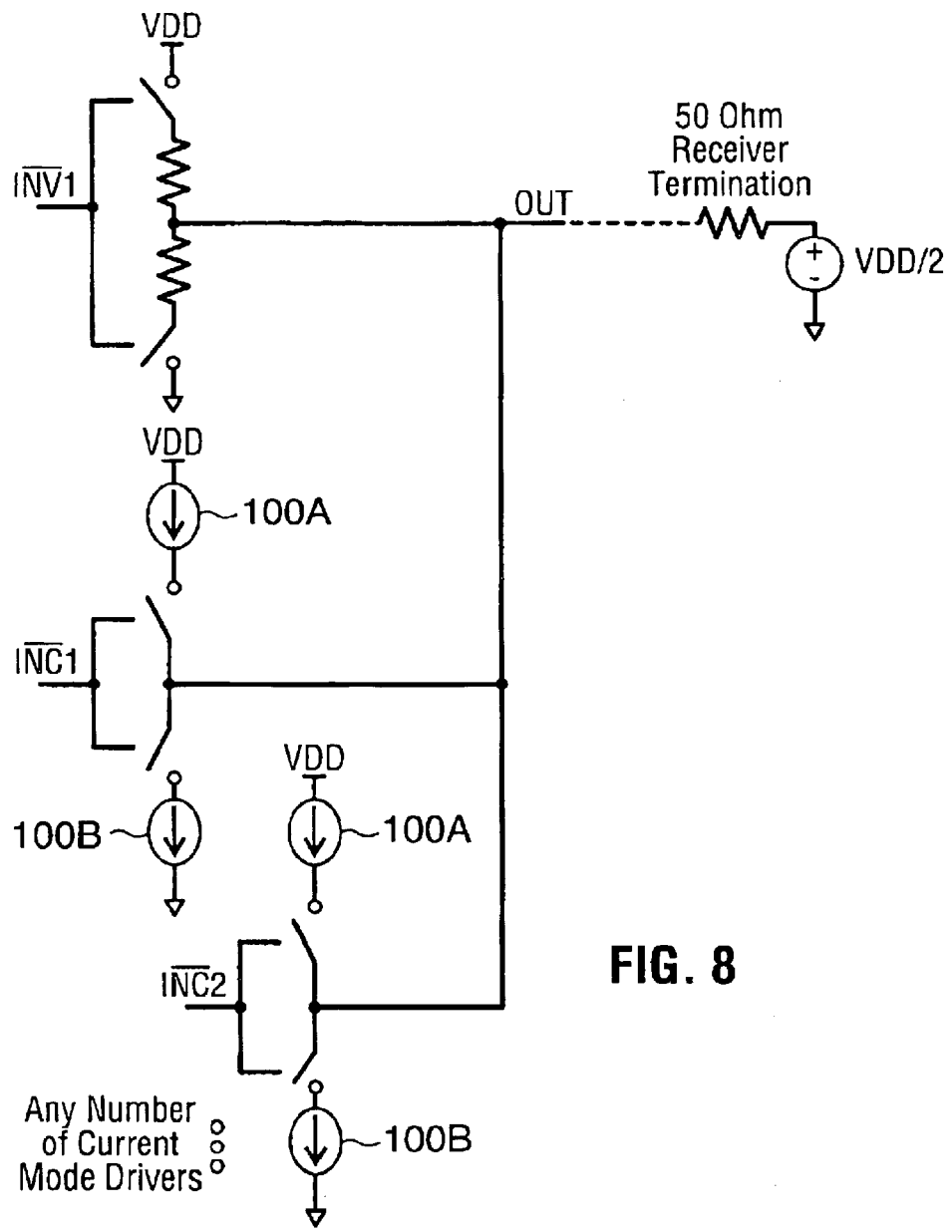
FIG. 8 is an idealized schematic similar to FIG. 7 using many current mode sources in parallel.

FIG. 6 illustrates such a single ended driver, where a series terminated voltage drive M0, M2 is connected in parallel with a current mode driver at point 150 which is connected to a 50 ohm termination resistor which in turn is connected to a voltage source VDD/2. An idealized equivalent circuit is shown in FIG. 7, where transistor pairs are replaced with equivalent switches SW1, SW2 SW3. A further abstraction of the single ended application is shown in FIG. 8, in which plural current sources 100A and 100B are connected to further current mode drivers in parallel. There may be many current mode drivers and many voltage mode drivers with the inputs different signals. The voltage mode driver need not have the same input as the current mode driver in the general case.

In FIGS. 6, 7 and 8 for full efficiency, INV1 should be the same as INC1, however they do not have to be the same signal. Some applications could require that those signals be different.

The mixed voltage/current mode driver may contain multiple voltage mode drivers and multiple current mode driver stages. These can be controlled separately or together. One example of such a set-up is to use a pre-emphasis driver. A separate LVDS type driver can be used to drive the voltage level on the output higher for the transition period of the output signal.

Figure 9:
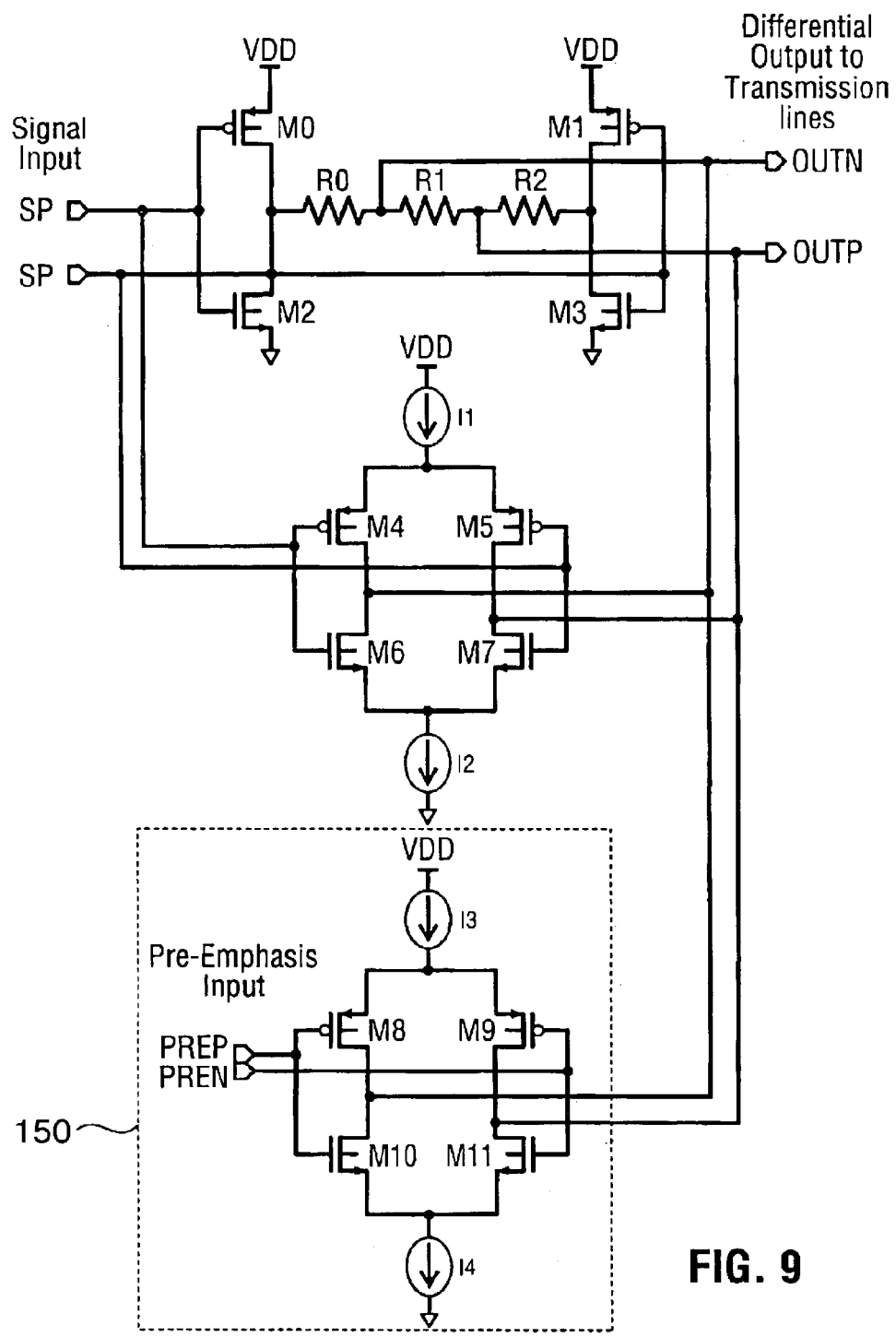
FIG. 9 is a schematic diagram of an alternative embodiment to the circuit in FIG. 4 using a pre-emphasis sub-circuit.

FIG. 9 illustrates such an implementation. The circuit in FIG. 9 is similar to that illustrated in FIG. 4 except that an extra LVDS type driver sub-circuit 150 is coupled in parallel with the two previous sub-circuits. This third sub-circuit 150 is coupled in parallel to the two outputs OUTN and OUTP. A pair of pre-emphasis inputs PREP and PREN are fed into the third subcircuit 150. The arrangement of the third sub circuit 150 is identical to the arrangement of the second sub-circuit 30 in FIG. 4 except that the inputs to the third sub-circuit 150 are provided by the pre-emphasis inputs PREN and PREP and not by the regular inputs SP and SN. Other extra subcircuits may be coupled to either of the arrangements in FIGS. 4 and 9 to provide different performance characteristics.

As can be seen in FIG. 9, two pairs of pre-emphasis transistors M8 and M10, M9 and M11 are provided along with two pre-emphasis current sources 100C, 100D. Each pair of pre-emphasis transistors consists of a pMOS transistor M8, M9 and of nMOS transistors M10, M11. For each pair of transistors the gate leads of one pMOS transistor and of one nMOS transistor are coupled to a pre-emphasis input.

Similarly, for each pair of transistors the drain leads of one pMOS transistor and of one nMOS transistor are coupled to one of the outputs OUTP and OUTN. The source lead of each transistor is coupled to one of the other of the pre-emphasis current sources. It should be noted that if a pMOS transistor and an nMOS transistor have their gate leads coupled to the same pre-emphasis input, these two transistors should have their drain leads coupled to the same output.

We claim:

1. A mixed voltage/current mode output driver circuit comprising:

a series terminated voltage mode driver circuit connected in parallel with a current mode driver circuit between a voltage source and ground, the outputs of said voltage and current mode driver circuits being connected in parallel and to a transmission line, the voltage mode driver circuit comprising:

a pair of inverter circuits;

a resistor divider circuit coupled between the pair of inverter circuits, the resistor divider circuit being divided into a first section, a second section, and a third section and having a pair of ends, each section being between the pair of ends, wherein a first input is coupled to a first one of the pair of inverter circuits;

a second input is coupled to a second one of the pair of inverter circuits;

the output is coupled to a first node between the first and second sections of the resistor divider circuit;

a binary value applied to the first input is the same as a binary value received at the first output; and a binary value applied to the second input is the same as a binary value received at the second output.

2. A circuit as in claim 1, wherein each inverter circuit comprises:

an inverter pMOS transistor with a source lead coupled to a voltage source, a gate lead coupled to a common input node, and a drain lead coupled to a common output node; and an inverter nMOS transistor with a gate lead coupled to the common input node, a drain lead coupled to the common output node, and a source lead coupled to ground, and wherein the common input node is further coupled to one of a pair of inputs; and the common output node is further coupled to an end of the resistor divider circuit.

3. A circuit as in claim 2 wherein the current mode driver circuit comprises:

two pairs of transistors, each pair comprising a pMOS transistor and an nMOS transistor; and a pair of current sources, wherein for each pair of transistors, the gate leads of the pair of transistors are coupled to an input node;

the drain leads of the pair of transistors are coupled to an output node;

a source lead of the pMOS transistor is coupled to one of the pair of current sources; and a source lead of the nMOS transistor is coupled to the other current source, each input node is coupled to one of the pair of inputs;

each output node is coupled to one of the pair of outputs;

one current source is coupled between a voltage source
and leads of the pMOS transistors; and the other current source is coupled between a voltage
source and leads of the nMOS transistors and ground.

4. A circuit as in claim 3 wherein the pMOS transistors are a differential pair whose source nodes are connected to a pMOS current source.

5. A mixed voltage/current mode output driver circuit comprising:

a series terminated voltage mode driver circuit connected in parallel with a current mode driver circuit between a voltage source and around.

the outputs of said voltage and current mode driver circuits being connected in parallel and to a transmission line, the current mode driver circuit comprising:

two pairs of transistors, each pair comprising a pMOS transistor and an nMOS transistor; and a pair of current sources, wherein for each pair of transistors,
the gate leads of the pair of transistors are coupled to an input node;
the drain leads of the pair of transistors are coupled to an output node;
a source lead of the pMOS transistor is coupled to one of the pair of current sources; and
a source lead of the nMOS transistor is coupled to the other of the pair of current sources, each input node is coupled to one of the pair of inputs;
each output node is coupled to one of the pair of outputs;

one of the pair of current sources is coupled between a voltage source leads of the PMOS transistors; and the other of the pair of current sources is coupled between a voltage source leads of the nMOS transistors and the ground.

6. A circuit as in claim 5 wherein for the two pairs of transistors, the pMOS transistors are a differential pair.

7. A circuit as in claim 5 wherein the nMOS transistors are a differential pair where source nodes are connected to an nMOS current source.

8. A mixed voltage/current mode output driver circuit comprising:

a series terminated voltage mode driver circuit connected in parallel with a current mode driver circuit between a voltage source and ground, the outputs of said voltage and current mode driver circuits being connected in parallel and to a transmission line, and a pre-emphasis circuit having an output coupled in parallel to the outputs of the voltage and current mode driver circuits, the pre-emphasis circuit receiving a pair of pre-emphasis inputs and providing a pre-emphasis for increasing an output voltage.

9. A circuit as in claim 8 wherein the pre-emphasis circuit comprises:

two pairs of pre-emphasis transistors, each pair comprising a pMOS transistor and an nMOS transistor;

a pair of pre-emphasis current sources, wherein for each pair of pre-emphasis transistors:
the gate leads of the pair of pre-emphasis transistors are coupled to a pre-emphasis input node;
the drain leads of the pair of pre-emphasis transistors are coupled to a pre-emphasis output node;
the source lead of the pMOS transistor is coupled to one of the pair of pre-emphasis current sources; and
the source lead of the nMOS transistor is coupled to the other pair of pre-emphasis current sources, each pre-emphasis input node is coupled to one of the pair of pre-emphasis inputs;

each pre-emphasis output node is coupled to one of the pair of outputs;

one of the pair of pre-emphasis current sources is coupled between a voltage source and leads of the pMOS transistor; and the other of the pair of pre-emphasis current sources is coupled between a voltage source and leads of the nMOS transistors and ground.

10. A mixed voltage/current mode output driver circuit comprising:

a plurality of series terminated voltage mode drivers;

a plurality of current mode drivers;

outputs of the voltage mode and current mode drivers being coupled in parallel, each of the series terminated voltage mode drivers comprising:

a pair of inverter circuits;

a resistor divider circuit coupled between the pair of inverter circuits, the resistor divider circuit being divided into a first section, a second section, and a third section and having a pair of ends each section being between the pair of ends, wherein the first input is coupled to a first one of the pair of inverter circuits;

the second input is coupled to a second one of the pair of inverter circuits;

the first output is coupled to a first node between the first and second sections of the resistor divider circuit; and the second output is coupled to a second node between the second section and the third section, and wherein a binary value applied to the first input is the same as a binary value received at the first output; and a binary value applied to the second input is the same as a binary value received at the second output.

11. A driver circuit as in claim 10 wherein each inverter circuit comprises:

an inverter pMOS transistor with a source lead coupled to a voltage source, a gate lead coupled to a common input node, and a drain lead coupled to a common output node; and an inverter nMOS transistor with a gate lead coupled to the common input node, a drain lead coupled to a common output node, and a source lead coupled to ground, and wherein the common input node is further coupled to one of the pair of inputs; and the common output node is further coupled to the resistor divider circuit.

12. A mixed voltage/current mode output driver circuit comprising:

a plurality of series terminated voltage mode drivers;

a plurality of current mode drivers;

outputs of the voltage mode and current mode drivers being coupled in parallel, one of the current mode drivers comprising:

two pairs of transistors, each pair comprising a pMOS transistor and an nMOS transistor; and a pair of current sources, wherein for each pair of transistors, the gate leads of the pair of transistors are coupled to an input node;

the drain leads of the pair of transistors are coupled to an output node;

the source lead of the pMOS transistor is coupled to one of the pair of current sources; and the source lead of the nMOS transistor is coupled to the other of the pair of current sources, each input node is coupled to one of the pair of inputs;

each output node is coupled to one of the pair of outputs;

one of the pair of current sources is coupled between a voltage source and leads of the pMOS transistors; and the other of the pair of current sources is coupled between a voltage source and leads of the nMOS transistors and the ground.

13. A mixed voltage/current mode output driver circuit comprising:

a plurality of series terminated voltage mode drivers;

a plurality of current mode drivers;

outputs of the voltage mode and current mode drivers being coupled in parallel, one of the current mode drivers comprising:

two pairs of pre-emphasis transistors, each pair comprising a pMOS transistor and an nMOS transistor;

a pair of pre-emphasis current sources, for each pair of pre-emphasis transistors:

the gate leads of the pair of pre-emphasis transistors are coupled to a pre-emphasis input node;

the drain leads of the pair of pre-emphasis transistors are coupled to a pre-emphasis output node;

the source lead of the pMOS transistor is coupled to one of the pair of pre-emphasis current sources; and the source lead of the nMOS transistor is coupled to the other of the pair of pre-emphasis current sources, each pre-emphasis input node is coupled to one of the pair of pre-emphasis inputs;

each pre-emphasis output node is coupled to one of the pair of outputs;

one of the pair of pre-emphasis current sources is coupled between a voltage source and leads of the pMOS transistor; and the other of the pair of pre-emphasis current sources is coupled between a voltage source and leads of the nMOS transistors and ground.

* * * * *

UNITED STATES PATENT AND TRADEMARK OFFICE
CERTIFICATE OF CORRECTION

PATENT NO.    : 6,812,733 B1
DATED         : November 2, 2004
INVENTOR(S)   : John Philip Plasterer et al.

It is certified that error appears in the above-identified patent and that said Letters Patent is hereby corrected as shown below:

Column 7,
Line 12, delete "around" and insert therefor -- ground --;
Line 31, insert -- and -- between the words "voltage source" and "leads";
Line 31, delete "PMOS" and insert therefor -- pMOS --;
Line 33, insert -- and -- between the words "voltage source" and "leads";

Column 8,
Line 2, insert -- of the -- between the words "other" and "pair"; and
Line 24, insert -- , -- between the words "ends" and "each".

Signed and Sealed this

Twenty-ninth Day of March, 2005

JON W. DUDAS
*Director of the United States Patent and Trademark Office*